United States Patent
Takai et al.

(10) Patent No.: US 10,961,414 B2
(45) Date of Patent: Mar. 30, 2021

(54) POLISHING SLURRY, METHOD OF MANUFACTURING THE SAME, AND METHOD OF MANUFACTURING SEMICONDUCTOR DEVICE

(71) Applicant: SAMSUNG ELECTRONICS CO., LTD., Suwon-si (KR)

(72) Inventors: Kenji Takai, Hwaseong-si (KR); Sang Eui Lee, Hwaseong-si (KR); Ken Kokubo, Osaka (JP); Eigo Miyazaki, Hwaseong-si (KR); Do Yoon Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/421,568

(22) Filed: May 24, 2019

(65) Prior Publication Data

US 2020/0024482 A1    Jan. 23, 2020

(30) Foreign Application Priority Data

Jul. 23, 2018  (KR) ................ 10-2018-0085335

(51) Int. Cl.
| | |
|---|---|
| *H01L 21/321* | (2006.01) |
| *H01L 21/306* | (2006.01) |
| *H01L 21/304* | (2006.01) |
| *H01L 21/302* | (2006.01) |
| *C09K 3/14* | (2006.01) |
| *C09G 1/02* | (2006.01) |
| *C09G 1/00* | (2006.01) |

(52) U.S. Cl.
CPC ................ *C09G 1/02* (2013.01); *C09G 1/00* (2013.01); *C09K 3/1454* (2013.01); *C09K 3/1463* (2013.01); *H01L 21/302* (2013.01); *H01L 21/304* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,294,732 | A | 3/1994 | Chiang et al. |
| 5,648,523 | A | 7/1997 | Chiang |
| 7,300,958 | B2 | 11/2007 | Kataoka et al. |
| 7,648,691 | B2 | 1/2010 | Nagata et al. |
| 7,754,054 | B2 | 7/2010 | Mitra et al. |
| 7,900,855 | B2 | 3/2011 | Asahi et al. |

(Continued)

FOREIGN PATENT DOCUMENTS

| | | |
|---|---|---|
| CN | 1316411 A | 10/2001 |
| CN | 102849717 A | 1/2013 |

(Continued)

OTHER PUBLICATIONS

H. W. Kroto et al., "C60: Buckminsterfullerene," Nature, Nov. 14, 1985, pp. 162-163, vol. 318.

(Continued)

*Primary Examiner* — Stephanie P Duclair
(74) *Attorney, Agent, or Firm* — Cantor Colburn LLP (57) ABSTRACT

A polishing slurry including a composite including a hydrophilic fullerene and an ionic compound, a method of manufacturing the same, and a method of manufacturing a semiconductor device.

15 Claims, 7 Drawing Sheets

(56) References Cited

U.S. PATENT DOCUMENTS

| | | | |
|---|---|---|---|
| 8,920,682 B2* | 12/2014 | Texter | H01B 1/20 |
| | | | 252/511 |
| 8,957,261 B2 | 2/2015 | Kokubo et al. | |
| 8,987,526 B2 | 3/2015 | Kokubo et al. | |
| 9,334,214 B2 | 5/2016 | Kokubo et al. | |
| 2005/0008560 A1 | 1/2005 | Kataoka et al. | |
| 2005/0098776 A1 | 5/2005 | Geckeler et al. | |
| 2011/0086206 A1* | 4/2011 | Scheffer | C09D 177/00 |
| | | | 428/195.1 |
| 2012/0053288 A1* | 3/2012 | Morishita | B82Y 30/00 |
| | | | 524/547 |
| 2012/0183468 A1 | 7/2012 | Farrell et al. | |
| 2012/0270400 A1* | 10/2012 | Takegoshi | C09G 1/02 |
| | | | 438/692 |
| 2013/0102812 A1* | 4/2013 | Chung | C09K 11/06 |
| | | | 568/609 |
| 2015/0111025 A1* | 4/2015 | Nishino | B82Y 40/00 |
| | | | 428/323 |

FOREIGN PATENT DOCUMENTS

| | | |
|---|---|---|
| CN | 104555977 A | 4/2015 |
| JP | 2004155674 A | 6/2004 |
| JP | 2004168752 A | 6/2004 |
| JP | 5250433 A | 7/2013 |
| JP | 2015218127 A | 12/2015 |
| JP | 2016098354 A | 5/2016 |
| KR | 20040018676 A | 3/2004 |
| KR | 20050035782 A | 4/2005 |
| KR | 20090078684 A | 7/2009 |
| KR | 20100028976 A | 3/2010 |
| KR | 20110030171 A | 3/2011 |
| WO | 2005061444 A1 | 7/2005 |
| WO | 2006028297 A1 | 3/2006 |
| WO | 2007020939 A1 | 2/2007 |
| WO | 2008096763 A1 | 8/2008 |

OTHER PUBLICATIONS

Ken Kokubo et al., "Facile Synthesis of Highly Water-Soluble Fullerenes More Than Half-Covered by Hydroxyl Groups," ACS Nano, American Chemical Society, Jan. 10, 2008, pp. 327-333, vol. 2, Issue No. 2.

Nanochemical Laboratory, "Synthesis of Water-Soluble Polyhydroxylated Fullerenes (Fullerenols) C60(OH)n By Direct Hydroxylation of Fullerene C60 From Suspensions of Fullerene in Water", Jun. 3, 2017, www.nanoclaster.ru/Synthesis a hyper polyhydroxylated fullerenol C60(OH)60 by direct hydroxylation of Fullerene from suspensions of Fullerene in water.

Pu Zhang et al., "Effective Mechanochemical Synthesis of [60]Fullerols," Synthetic Communications: An International Journal for Rapid Communication of Synthetic Organic Chemistry, 2003, Published online: Aug. 20, 2006, pp. 2469-2474, vol. 33, No. 14.

Sadia Afreen et al., "Hydration or hydroxylation: direct synthesis of fullerenol from pristine fullerene [C60] via acoustic cavitation in the presence of hydrogen peroxide," RSC Advances, Royal Society of Chemistry, Jun. 21, 2017, pp. 31930-31939, vol. 7.

Yasuhiro Takaya et al., "Surface analysis of the chemical polishing process using a fullerenol slurry by Raman spectroscopy under surface plasmon excitation," CIRP Annals—Manufacturing Technology, 2013, pp. 571-574, vol. 62.

Non-Final Office Action, dated Apr. 29, 2020, U.S. Appl. No. 16/421,633.

* cited by examiner

POLISHING SLURRY, METHOD OF MANUFACTURING THE SAME, AND METHOD OF MANUFACTURING SEMICONDUCTOR DEVICE

CROSS-REFERENCE TO RELATED APPLICATION

This application claims priority to and the benefit of Korean Patent Application No. 10-2018-0085335 filed in the Korean Intellectual Property Office on Jul. 23, 2018, and all the benefits accruing therefrom under 35 U.S.C. § 119, the entire contents of which are incorporated herein by reference.

BACKGROUND

1. Field

A polishing slurry, a method of manufacturing the same, and a method of manufacturing a semiconductor device using the polishing slurry are disclosed.

2. Description of the Related Art

A semiconductor device is generally required to have a structure with a planar surface during the manufacturing process, and the structure may be obtained by a polishing process. One example of the polishing process is chemical mechanical polishing (CMP). CMP is a process including providing a polishing slurry between a substrate to be polished and a polishing pad, contacting the semiconductor substrate to the polishing pad, and rotating the same to planarize a surface of the substrate by pressing and rotating.

Recently, high-performance and highly-integrated semiconductor devices having a structure with a fine pitch of less than or equal to about 10 nm have been used, resulting in a need for polishing slurries capable of providing the fine-pitch structure.

SUMMARY

An embodiment provides a polishing slurry capable of improving a polishing rate while decreasing damages and shape deformations of a structure.

An embodiment provides a method of manufacturing the polishing slurry.

An embodiment provides a method of manufacturing a semiconductor device using the polishing slurry.

According to an embodiment, a polishing slurry includes a composite including a hydrophilic fullerene and an ionic compound.

The ionic compound may include at least one hydrophobic functional group.

The ionic compound may include a quaternary ammonium salt.

The ionic compound may include alkyl-substituted quaternary ammonium salt.

The ionic compound may include tetrabutyl ammonium hydroxide, tetrapropyl ammonium hydroxide, tetraethyl ammonium hydroxide, tetramethyl ammonium hydroxide, or a combination thereof.

The hydrophilic fullerene may include at least one hydrophilic functional group bound to a fullerene core and the hydrophilic functional group may include a hydroxyl group, an amino group, a carbonyl group, a carboxyl group, a sulfhydryl group, a phosphate group, or a combination thereof.

The hydrophilic fullerene may be a plurality of hydrophilic fullerenes that include an average of 20 to 44 functional groups bound to the fullerene core.

The plurality of hydrophilic fullerenes may be represented by $C_x(OH)_y$ (wherein, x is 60, 70, 74, 76, or 78 and y is 2 to 44).

The plurality of hydrophilic fullerenes may be represented by $C_x(OH)_y$ (wherein, x is 60, 70, 74, 76, or 78 and y is 20 to 44).

The composite including the hydrophilic fullerene and the ionic compound may be represented by Chemical Formula 1.

$$C_x(OH)_{y'}(O\text{-}IP)_z \qquad \text{Chemical Formula 1}$$

In Chemical Formula 1,
IP is an alkyl-substituted quaternary ammonium salt,
x is 60, 70, 74, 76, or 78,
y is 2 to 44, and
z is 1 to 40.

The polishing slurry may further include a chelating agent, an oxidizing agent, a surfactant, a dispersing agent, or a combination thereof.

According to an embodiment, a method of manufacturing a polishing slurry includes combining fullerene, an ionic compound, and an oxidizing agent to a mixed solvent comprising an organic solvent and water to provide a mixture, and heat treating the mixture to form a composite including a hydrophilic fullerene and an ionic compound.

The heat treating may be performed at about 30° C. to about 90° C.

The organic solvent may include toluene, benzene, 1-methylnaphthalene, 1,2,4-trimethylbenzene, p-xylene, or a combination thereof.

The ionic compound may include a quaternary ammonium salt.

The ionic compound may include tetrabutyl ammonium hydroxide, tetrapropyl ammonium hydroxide, tetraethyl ammonium hydroxide, tetramethyl ammonium hydroxide, or a combination thereof.

The ionic compound may be provided in an amount of about 10 to about 500 parts by weight based on 100 parts by weight of the fullerene.

The hydrophilic fullerene may be represented by $C_x(OH)_y$ (wherein, x is 60, 70, 74, 76, or 78 and y is 20 to 44).

The composite including the hydrophilic fullerene and the ionic compound may be present in the water and the method may further include removing the organic solvent after forming the composite including the hydrophilic fullerene and the ionic compound.

According to an embodiment, a method of manufacturing a semiconductor device including polishing a surface of the semiconductor device using the polishing slurry is provided.

The polishing slurry may be substituted for a silica abrasive and may improve a polishing rate while decreasing damage to and shape deformation of a structure.

DETAILED DESCRIPTION

Example embodiments will hereinafter be described in detail, and may be easily performed by a person having an ordinary skill in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the phrase "alkyl-substituted" refers to a compound or a group or a moiety wherein at least one hydrogen atom thereof is substituted with a C1 to C30 alkyl group. In an embodiment the alkyl group is a C1 to C20 group, or a C1 to C12 group, or a C1 to C6 group.

"Alkyl" means a straight or branched chain, saturated, monovalent hydrocarbon group (e.g., methyl or hexyl).

Hereinafter, a polishing slurry according to an embodiment is described.

The polishing slurry according to an embodiment includes a composite including a hydrophilic fullerene and an ionic compound.

In the composite including the hydrophilic fullerene and the ionic compound, the hydrophilic fullerene and the ionic compound are paired in a form of an ion or a salt, for example, the hydrophilic fullerene may be anion, and the ionic compound may be cation. For example, the composite including the hydrophilic fullerene and the ionic compound may have a form that the ionic compound is adsorbed on the hydrophilic fullerene.

The hydrophilic fullerene may be a compound including a hydrophilic functional group bound to a fullerene core of the hydrophilic fullerene.

The fullerene core of the hydrophilic fullerene may generally be hydrophobic and may have hydrophilicity due to being bound to a hydrophilic functional group.

The fullerene core of the hydrophilic fullerene may be for example C60, C70, C74, C76, or C78, but is not limited thereto.

The hydrophilic functional group may be for example a hydroxyl group, an amino group, a carbonyl group, a carboxyl group, a sulfhydryl group, a phosphate group, or a combination thereof, but is not limited thereto. The hydrophilic functional group may be for example a hydroxyl group.

The composite including the hydrophilic fullerene may include a plurality of hydrophilic fullerenes and the hydrophilic fullerenes may include an average of at least 2 hydrophilic functional groups, for example an average of 2 to 44 hydrophilic functional groups, an average of 8 to 44 hydrophilic functional groups, an average of 12 to 44 hydrophilic functional groups, an average of 20 to 44 hydrophilic functional groups, an average of 20 to 40 hydrophilic functional groups, an average of 20 to 36 hydrophilic functional groups, an average of 32 to 44 hydrophilic functional groups, an average of 32 to 40 hydrophilic functional groups, or an average of 32 to 38 hydrophilic functional groups per fullerene core of the hydrophilic fullerenes.

Hydroxyl fullerene as used herein thus refers to a population of hydroxyl fullerenes having an average number of hydroxyl groups y. For example, the hydrophilic fullerene may be may be for example represented by $C_x(OH)_y$ (wherein, x may be 60, 70, 74, 76, or 78 and y may be 2 to 44).

For example, the hydrophilic fullerene may be hydroxyl fullerene, and may be for example represented by $C_x(OH)_y$ (wherein, x may be 60, 70, 74, 76, or 78 and y may be 12 to 44).

For example, the hydrophilic fullerene may be hydroxyl fullerene, and may be for example represented by $C_x(OH)_y$, (wherein, x may be 60, 70, 74, 76, or 78 and y may be 24 to 44).

For example, the hydrophilic fullerene may be hydroxyl fullerene, and may be for example represented by $C_x(OH)_y$, (wherein, x may be 60, 70, 74, 76, or 78 and y may be 32 to 44).

The ionic compound may be for example a cationic compound. The ionic compound may be for example an ammonium salt, for example a quaternary ammonium salt.

The ionic compound may have at least one hydrophobic functional group. The hydrophobic functional group may increase contact characteristics with respect to a structure to be polished and may control dispersibility of the hydrophilic fullerene to increase a polishing rate. The hydrophobic functional group may be for example a C1 to C30 alkyl group, a C3 to C30 cycloalkyl group, or a C6 to C30 aryl group, for example a methyl group, an ethyl group, a propyl group, a butyl group, a pentyl group, a hexyl group, a heptyl group, a cyclopentyl group, a cyclohexyl group, or a phenyl group, but is not limited thereto.

For example, the ionic compound may be a quaternary ammonium salt having at least one hydrophobic functional group, for example an alkyl-substituted quaternary ammonium salt, for example a C1 to C10 alkyl-substituted quaternary ammonium salt, for example tetrabutyl ammonium hydroxide, tetrapropyl ammonium hydroxide, tetraethyl ammonium hydroxide, tetramethyl ammonium hydroxide, or a combination thereof.

The ionic compound may form a composite with hydrophilic fullerene or may function as a catalyst during synthesis of hydrophilic fullerene.

For example, the composite including the hydrophilic fullerene and the ionic compound may be represented by Chemical Formula 1, but is not limited thereto.

Chemical Formula 1

$$C_x(OH)_y \cdot (O\text{-}IP)_z$$

In Chemical Formula 1,

IP may be a salt of an ionic compound, for example a quaternary ammonium salt, for example an alkyl-substituted quaternary ammonium salt, for example a C1 to C10 alkyl-substituted quaternary ammonium salt, for example tetrabutyl ammonium, tetrapropyl ammonium, tetraethyl ammonium, tetramethyl ammonium, or a mixture thereof, x may be 60, 70, 74, 76, or 78, y may be 2 to 44, and z may be 1 to 40.

The composite including the hydrophilic fullerene and the ionic compound may be a hard particle having a size of angstrom or several nanometers, for example, having a particle diameter of less than or equal to about 10 nm, less than or equal to about 5 nm, less than or equal to about 3 nm, less than or equal to about 2 nm, or less than or equal to about 1 nm.

As the composite including the hydrophilic fullerene and the ionic compound is a particle having a high hardness, the composite including the hydrophilic fullerene and the ionic compound may function as an abrasive in the polishing slurry, and as the composite including the hydrophilic fullerene and the ionic compound has a very small particle size unlike the conventional abrasive particle such as silica having a particle diameter of tens to hundreds of nanometers, the composite including the hydrophilic fullerene and the ionic compound may be effectively applied for, e.g., to, a fine-pitched structure having a width of less than or equal to about 10 nm. Thereby, the composite including the hydrophilic fullerene and the ionic compound may reduce damage or deformation such as scratch, dishing, erosion, or a combination thereof on the structure to be polished.

In addition, the composite including the hydrophilic fullerene and the ionic compound may enhance a contact characteristic with respect to the structure to be polished and a polishing selectivity to the material and also may effectively increase a polishing rate by adjusting a dispersion of the hydrophilic fullerene. For example, when the polishing slurry polishes a metal structure, the composite including the hydrophilic fullerene and the ionic compound may form a complex with a metal of the metal structure, and a polishing rate of the metal structure may be effectively increased.

The composite including the hydrophilic fullerene and the ionic compound may be obtained by adding the ionic compound when synthesizing the hydrophilic fullerene. For example, the ionic compound may be present as a composite with the hydrophilic fullerene in the slurry, and the remaining ionic compound may be independently present in the slurry. The polishing slurry may further include a hydrophilic fullerene and an ionic compound which do not form the composite.

The composite including the hydrophilic fullerene and the ionic compound may be included in, for example, about 0.001 weight percent (wt %) to about 10 wt %, about 0.001 wt % to about 5 wt %, or about 0.001 wt % to about 1 wt % based on the total amount of the polishing slurry (including solvent).

The polishing slurry may further include an additive and the additive may be for example a chelating agent, an oxidizing agent, a surfactant, a dispersing agent, a pH controlling agent, or a combination thereof, but is not limited thereto.

The chelating agent may be for example phosphoric acid, nitric acid, citric acid, malonic acid, a salt thereof, or a combination thereof, but is not limited thereto.

The oxidizing agent may be for example hydrogen peroxide, sodium hydroxide, potassium hydroxide, or a combination thereof, but is not limited thereto.

The surfactant may be an ionic or non-ionic surfactant, for example a copolymer of ethylene oxide, a copolymer of propylene oxide, an amine compound, or a combination thereof, but is not limited thereto.

The dispersing agent promotes uniform dispersion of a composite including the hydrophilic fullerene and the ionic compounds and increases polishing efficiency or a polishing rate and may be for example a poly(meth)acrylic acid, poly(meth)acrylic-co-maleic acid, polyacrylonitrile-co-butadiene-acrylic acid, carboxylic acid, sulfonic ester, sulfonic acid, phosphoric ester, cellulose, diol, a salt thereof, or a combination thereof, but is not limited thereto.

The pH controlling agent may control pH of the polishing slurry and may be for example inorganic acid, organic acid, a salt thereof, or a combination thereof. The inorganic acid may include for example nitric acid, hydrochloric acid, phosphoric acid, sulfuric acid, hydrofluoric acid, bromic acid, iodic acid or a salt thereof, the organic acid may include for example formic acid, malonic acid, maleic acid, oxalic acid, adipic acid, citric acid, acetic acid, propionic acid, fumaric acid, lactic acid, salicylic acid, benzoic acid, succinic acid, phthalic acid, butyric acid, glutaric acid, glutamic acid, glycolic acid, lactic acid, aspartic acid, tartaric acid, a salt thereof, or a combination thereof, but is not limited thereto.

Each additive may be independently included in a trace amount of for example about 1 parts per million by weight (ppm) to about 100,000 ppm, but is not limited thereto.

The polishing slurry may further include a solvent capable of dissolving or dispersing the above components and the solvent may be for example water. The water may be for example distilled water, deionized water, or a combination thereof.

Hereinafter, a method of manufacturing the polishing slurry is described.

The polishing slurry according to an embodiment may be obtained by a one-pot synthesis method.

A method of manufacturing a polishing slurry according to an embodiment may include combining, for example adding fullerene, an ionic compound, and an oxidizing agent to a mixed solvent including an organic solvent and water and performing heat treatment to form a composite including a hydrophilic fullerene and an ionic compound.

In an embodiment, first, a mixed solvent including an organic solvent and water is prepared in one container. The organic solvent may be for example toluene, benzene, 1-methylnaphthalene, 1,2,4-trimethylbenzene, xylene, or a combination thereof and the water may be for example distilled water, deionized water, or a combination thereof. The organic solvent and the water may be mixed at a volume ratio of about 10:90 to about 90:10, for example, at a volume ratio of about 20:80 to about 80:20, about 30:70 to about 70:30, about 40:60 to about 60:40, or about 50:50. The organic solvent and the water have different polarity from each other, and may be phase-separated into an organic phase including the organic solvent and an aqueous phase including water.

Subsequently, the mixed solvent is combined with a fullerene, an ionic compound, and an oxidizing agent. The mixed solvent, the fullerene, the ionic compound, and the oxidizing agent may be combined in any order, for example, the fullerene, the ionic compound, and the oxidizing agent may be simultaneously added to the mixed solvent, or the fullerene may be preliminarily added and dispersed, and then the ionic compound and the oxidizing agent may be added thereto.

The fullerene may be for example C60, C70, C74, C76, or C78, but is not limited thereto.

The ionic compound may be for example a cationic compound, for example an ammonium salt, for example a quaternary ammonium salt. The ionic compound may have at least one hydrophobic functional group, for example a C1 to C30 alkyl group, a C3 to C30 cycloalkyl group, or a C6 to C30 aryl group, for example a methyl group, an ethyl group, a propyl group, a butyl group, a pentyl group, a hexyl group, a cyclopentyl group, a cyclohexyl group, or a phenyl group, but is not limited thereto. The ionic compound may be for example a quaternary ammonium salt having a hydrophobic functional group, for example an alkyl-substituted quaternary ammonium salt, for example a C1 to C10 alkyl-substituted quaternary ammonium salt, for example tetrabutyl ammonium hydroxide, tetrapropyl ammonium hydroxide, tetraethyl ammonium hydroxide, tetramethyl ammonium hydroxide, or a combination thereof.

The oxidizing agent may be for example hydrogen peroxide, sodium hydroxide, potassium hydroxide, or a combination thereof, but is not limited thereto.

The ionic compound may be included in an amount of about 10 to about 500 parts by weight based on 100 parts by weight of the fullerene.

The oxidizing agent may be included in an amount of about 500 to about 3,000 parts by weight based on 100 parts by weight of the fullerene.

The fullerene may be dispersed in the organic phase, and a low-value hydrophilic fullerene may be formed by a few hydrophilic groups such as hydroxyl groups present in the organic phase, e.g., the low-value hydrophilic fullerene may be formed with a relatively small number of hydrophilic groups such as hydroxyl groups present in the organic phase. A low-value hydrophilic fullerene means a fullerene having a small number of hydrophilic groups, for example, a fullerene having about 2 to about 10 hydrophilic groups, for example, a hydrophilic fullerene represented by $C_x(OH)_y$ (wherein, x is 60, 70, 74, 76, or 78 and y is 2 to 10).

Subsequently, the mixture is subjected to a heat treatment. The heat treatment may be performed at, for example, about 30° C. to about 90° C. for about 120 minutes to about 1,200 minutes. The low-value hydrophilic fullerene may be moved to, e.g., incorporated in, an aqueous phase by the heat treatment, and the low-value hydrophilic fullerene in the aqueous phase may be reacted with an oxidizing agent such as hydrogen peroxide to prepare a high-value hydrophilic fullerene. A high-value hydrophilic fullerene means fullerene having many, e.g., a large number of, hydrophilic groups, for example, a fullerene having about 32 to about 44 hydrophilic groups, or a hydrophilic fullerene represented by, for example, $C_x(OH)_y$ (wherein, x is 60, 70, 74, 76, or 78 and y is 32 to 44). The high-value hydrophilic fullerene may be present as anion in an aqueous phase and may be paired with an ionic compound present in the aqueous phase to provide a composite including a hydrophilic fullerene and an ionic compound.

The composite including the hydrophilic fullerene and the ionic compound may be dispersed in an aqueous phase, which is water; and an organic phase of an organic solvent may be removed after forming the composite including the hydrophilic fullerene and the ionic compound.

Selectively, the various kinds of additives, water, or a combination thereof may be added to water in which the composite including the hydrophilic fullerene and the ionic compound is dispersed to provide polishing slurry.

The polishing slurry may be employed for providing various structures, for example, the polishing slurry may be applied for, e.g., in, a polishing process of a conductor such as a metal line or a polishing process of an insulator such as an insulation layer or a shallow trench isolation (STI).

Hereinafter, a method of manufacturing a semiconductor device using the polishing slurry is exemplified.

FIGS. 1 to 4 are cross-sectional views sequentially showing a method of manufacturing a semiconductor device according to an embodiment.

Figure 1:
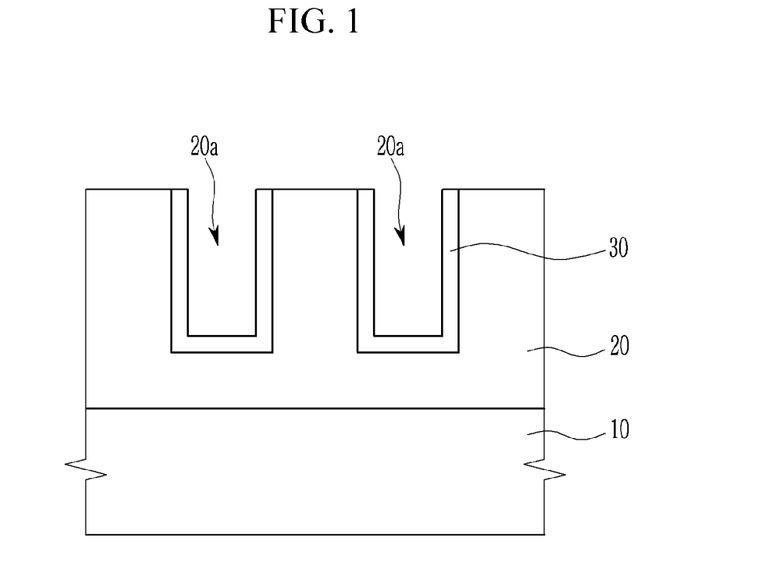
FIGS. 1 to 4 are cross-sectional views sequentially showing a method of manufacturing a semiconductor device according to an embodiment.

Referring to FIG. 1, an interlayer insulating layer 20 is formed on a semiconductor substrate 10. The interlayer insulating layer 20 may include an oxide, a nitride, an oxynitride, or a combination thereof. Subsequently, the interlayer insulating layer 20 is etched to provide a trench 20a. The trench 20a may have a width of less than or equal to about 10 nm. Subsequently, a barrier layer 30 is formed on the wall surface of the trench 20a. The barrier layer 30 may include, for example, Ta, TaN, or a combination thereof, but is not limited thereto.

Figure 2:
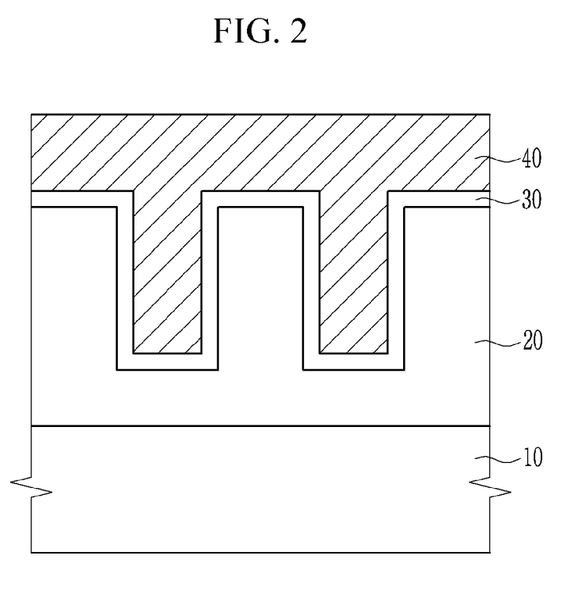

Referring to FIG. 2, a metal such as copper (Cu) is filled in the inside of the trench to provide a metal layer 40.

Figure 3:
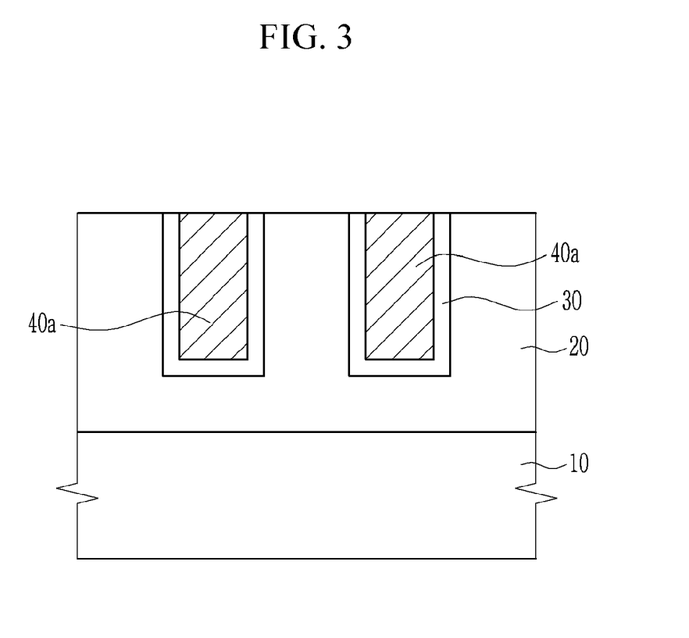

Referring to FIG. 3, a surface of each of the metal layer 40 and the barrier layer 30 is planarized to correspond to the surface of the interlayer insulating layer 20 to form a filled metal layer 40a. The planarization may be performed by a chemical mechanical polishing (CMP), and may use the polishing slurry.

For example, when the barrier layer 30 is a Ta layer, and the metal layer 40 is a Cu layer, it may be desirable that a polishing selectivity of Ta to Cu of the polishing slurry be relatively high, for example, it may be desirable that a polishing selectivity of Ta to Cu of the polishing slurry is greater than about 50:1.

Figure 4:
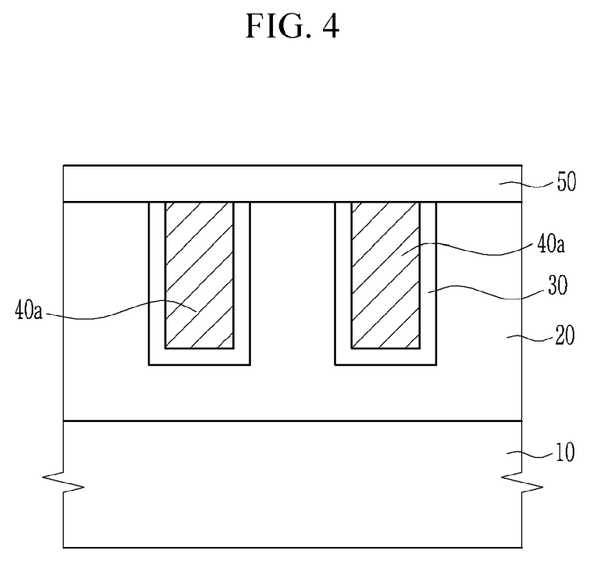

Referring to FIG. 4, a capping layer 50 is formed on the filled metal layer 40a, the barrier layer 30, and the interlayer insulating layer 20. The capping layer 50 may include SiN, SiC, or a combination thereof, but is not limited thereto.

As described above, the method of manufacturing a semiconductor device according to an embodiment has been described, but it is not limited thereto, and it may be employed for providing a semiconductor device having various structures.

Hereinafter, the embodiments are illustrated in more detail with reference to examples. However, these examples are exemplary, and the present disclosure is not limited thereto.

Synthesis of Hydrophilic Fullerene

Reference Synthesis Example 2 grams (g) of fullerene (D100 (Frontier Carbon) including a main component of $C_{60}(OH)_{10}$) and 200 milliliters (ml) of 30 weight percent (wt %) hydrogen peroxide (Fuji Film Wako Pure Chemical) are added to a 500 ml flask and heated at 60° C. for 14 days. 1 liter (L) of isopropyl alcohol, 800 ml of ethyl acetate, and 1 L of hexane are sequentially added to a solvent after the synthesis to provide fullerene hydroxide, and the synthesized fullerene hydroxide is precipitated and dried to provide a hydroxide fullerene structure.

From the results of analyzing the obtained hydroxide fullerene structure according to the disclosed method of K. Kokubo, K. Matsubayashi, H. Tategaki, H. Takada and T. Oshima: ACS Nano, 2, 327-333 (2008) (hereinafter K. Kokubo et al.), it is understood that $C_{60}(OH)_{36}$ having an average number of hydroxy groups of 36 is synthesized.

Figure 6:
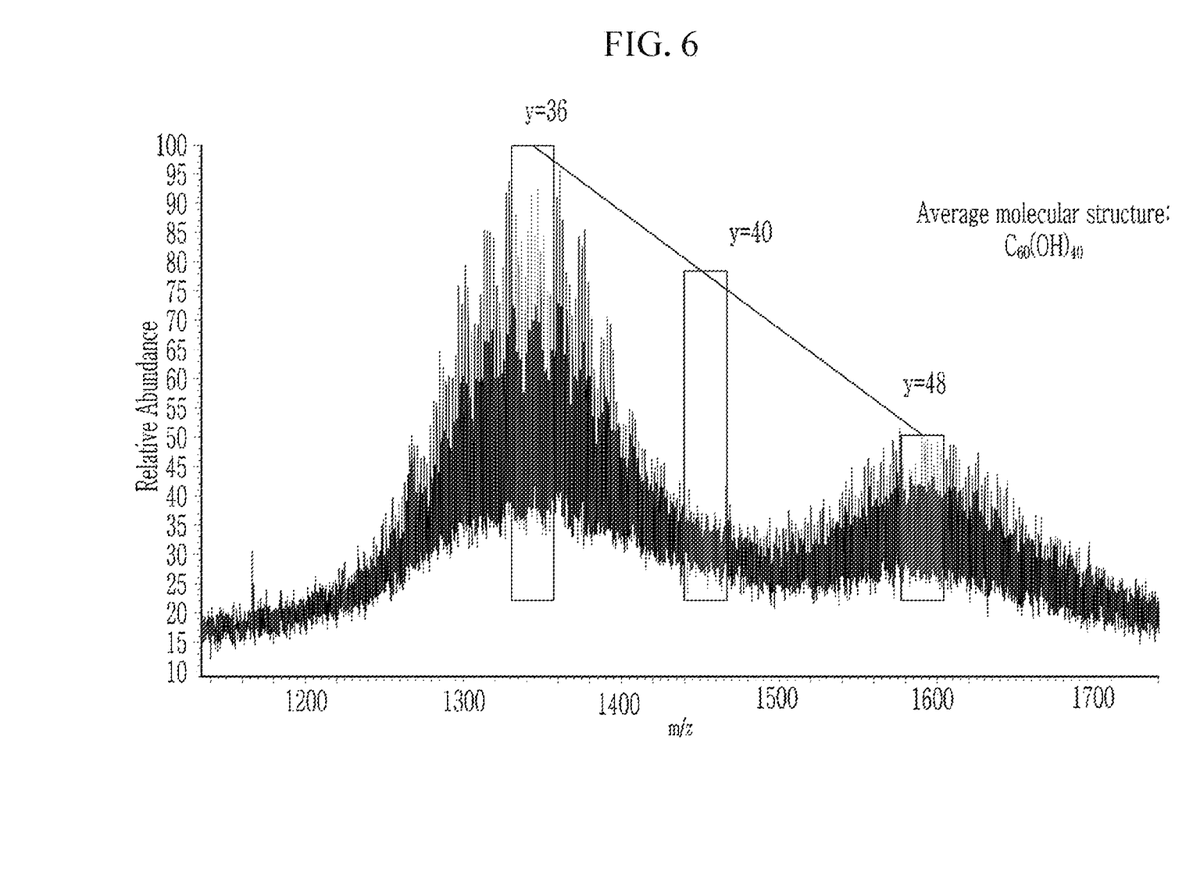
FIG. 6 is a liquid chromatography-mass spectrometry (LC-MS) graph of the compound obtained in Synthesis Example 1.
Figure 7:
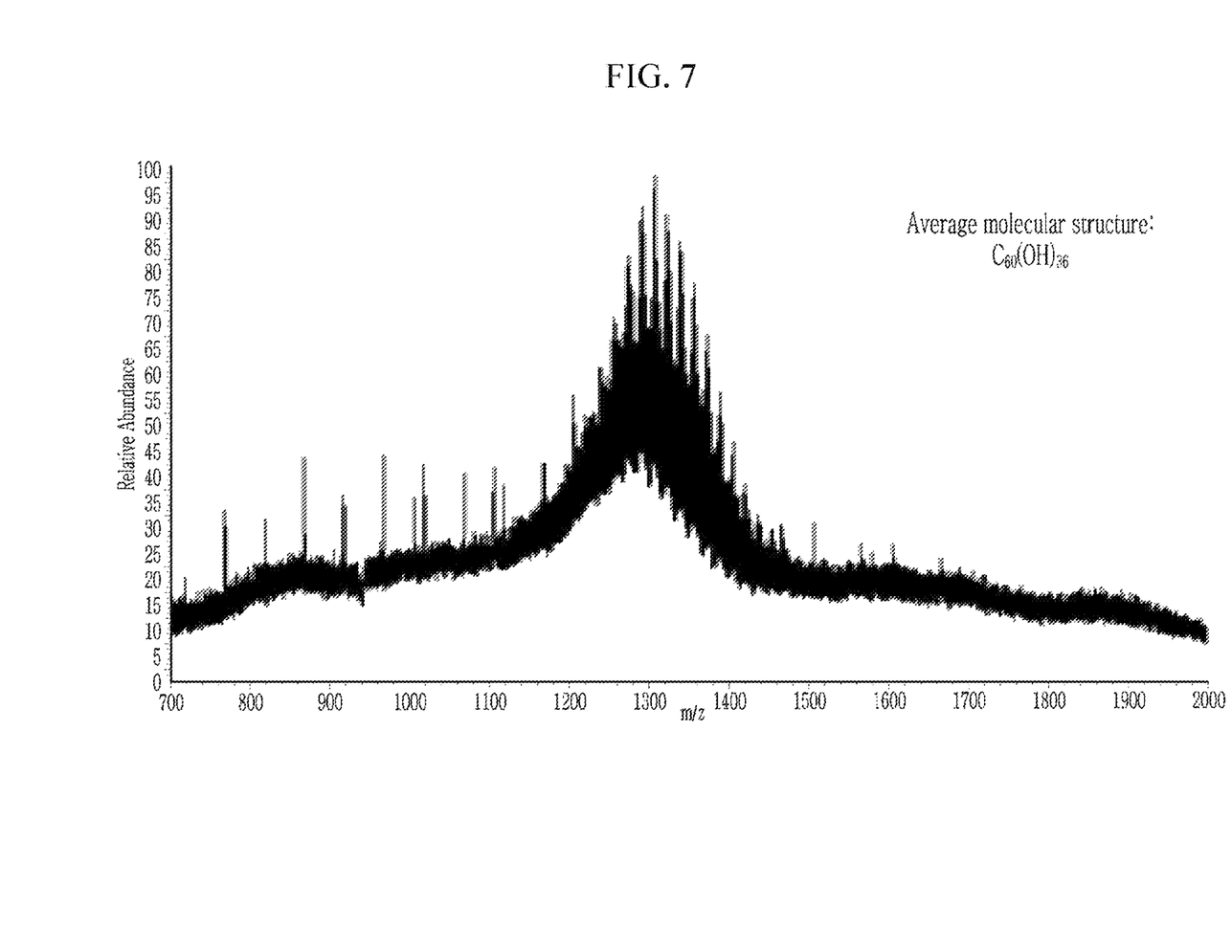
FIG. 7 is an LC-MS graph of the compound obtained in the Reference Synthesis Example.

FIG. 6 is a graph showing a mass analysis result by liquid chromatography-mass spectrometry (LC-MS) of the compound obtained in the Reference Synthesis Example.

Synthesis of Composite Including Hydrophilic Fullerene and Ionic Compound

Synthesis Example 1

2 g of D100 (Frontier Carbon, tradename) having a main component of $C_{60}(OH)_{10}$, 200 ml of 30 wt % hydrogen peroxide (Fuji Film Wako Pure Chemical), and 10 ml of 40 wt % tetrabutyl ammonium hydroxide (Tokyo Chemical Industry) are added to a 500 ml flask and heated at 70° C. for 17 hours. 1 L of isopropyl alcohol, 800 ml of ethyl acetate, and 1 L of hexane are sequentially added to a solvent after the synthesis to provide a hydroxide fullerene compound, and the synthesized hydroxide fullerene compound is precipitated and dried to provide a compound in which a part of hydroxyl groups of the hydroxide fullerene is coordinated with, e.g., bound to, tetrabutyl ammonium.

Figure 5:
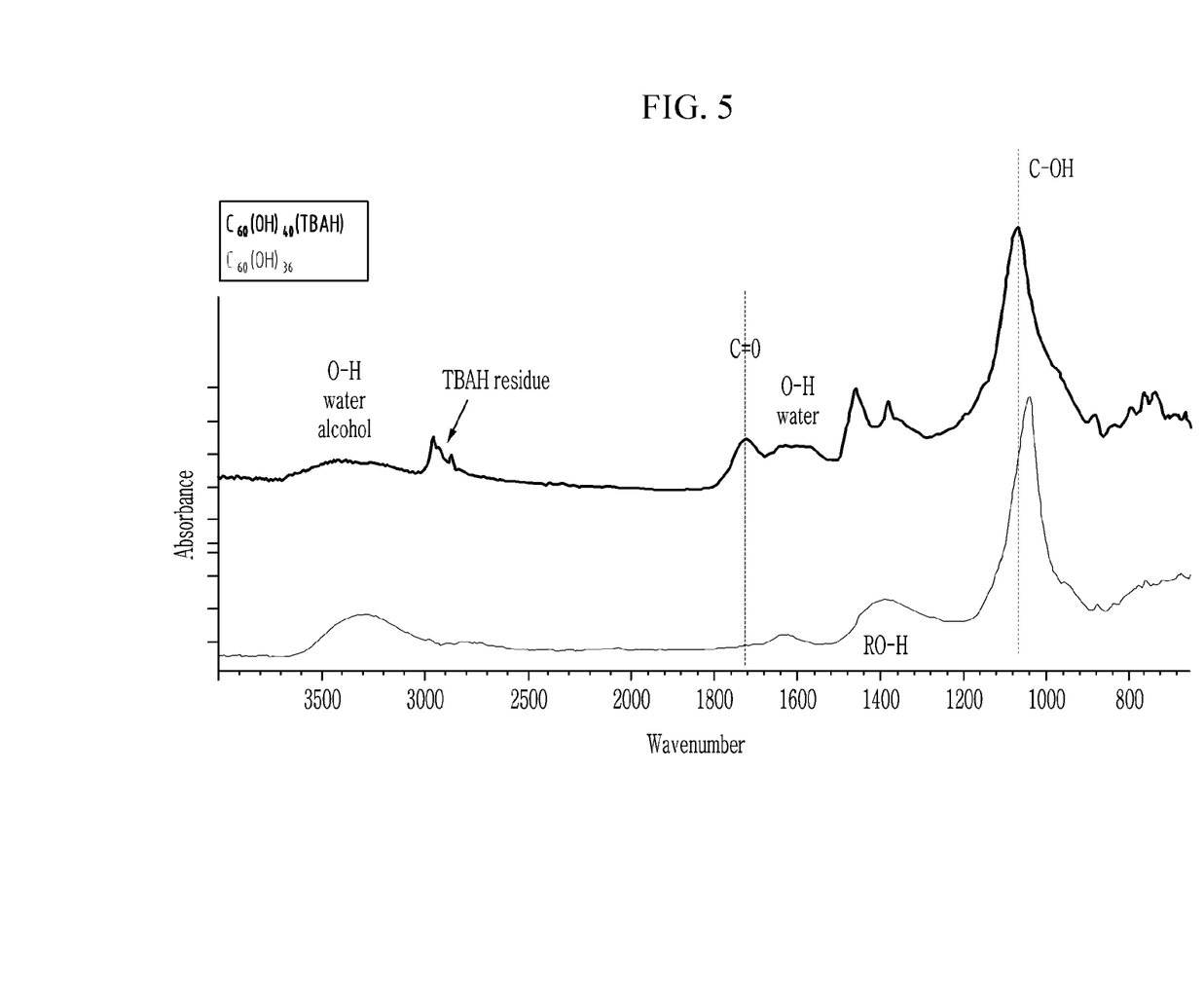
FIG. 5 is a Fourier-transform infrared spectroscopy (FT-IR) graph of the compounds obtained in Synthesis Example 1 and the Reference Synthesis Example.

FIG. 5 is a graph showing a Fourier-transform infrared spectroscopy (FT-IR) analysis of the compound obtained in Synthesis Example 1.

Referring to FIG. 5, a peak caused by a tetrabutyl ammonium hydroxide reside (TBAH residue) is observed, compared to the compound ($C_{60}(OH)_{36}$) obtained from the Reference Synthesis Example.

Subsequently, tetrabutyl ammonium hydroxide is removed by washing the same with acid, and then the structure is analyzed according to K. Kokubo et al., and the results show that $C_{60}(OH)_{40}$ having an average number of hydroxy groups of 40 is synthesized.

FIG. 6 is a graph shown a mass analysis result by LC-MS of the compound of Synthesis Example 1.

That is, the obtained compound may be estimated to have a $C_{60}(OH)_{40-m} \cdot O\text{-TBA}_n$ (n is 1 to 40) structure in which a part of protons of $C_{60}(OH)_{40}$ is substituted with tetrabutyl ammonium.

Synthesis Example 2

A compound in which a part of hydroxyl groups of the hydroxide fullerene is coordinated with, e.g., bound to, tetrapropyl ammonium is synthesized in accordance with the same procedure as in Synthesis Example 1, except that 10 ml of 40 wt % tetrapropyl ammonium hydroxide (Tokyo Chemical Industry) is used instead of 10 ml of 40 wt % tetrabutyl ammonium hydroxide.

The composite including hydrophilic fullerene and ionic compound is estimated to have a $C_{60}(OH)_{40-m} \cdot O\text{-TPA}_n$ (n is 1 to 40) structure in which a part of protons of $C_{60}(OH)_{40}$ is substituted with tetrapropyl ammonium according to the mass analysis results by LC-MS as in Synthesis Example 1.

Synthesis Example 3

A compound in which part of hydroxyl groups of the hydroxide fullerene is coordinated with, e.g., bound to, tetraethyl ammonium is synthesized in accordance with the same procedure as in Synthesis Example 1, except that 40 ml of 10 wt % tetraethyl ammonium hydroxide (Tokyo Chemical Industry) is used instead of 10 ml of 40 wt % tetrabutyl ammonium hydroxide.

As in Synthesis Example 1, the composite including hydrophilic fullerene and ionic compound is estimated to have a $C_{60}(OH)_{40-m} \cdot O\text{-TEA}_n$ (n is 1 to 40) structure in which a part of protons of $C_{60}(OH)_{40}$ is substituted with tetraethyl ammonium according to the mass analysis results by LC-MS as in Synthesis Example 1.

Synthesis Example 4

A compound in which part of hydroxyl groups of the hydroxide fullerene is coordinated with, e.g., bound to, tetramethyl ammonium is synthesized in accordance with the same procedure as in Synthesis Example 1, except that 40 ml of 10 wt % tetramethyl ammonium hydroxide (Tokyo Chemical Industry) is used instead of 10 ml of 40 wt % tetrabutyl ammonium hydroxide.

From the mass analysis results by LC-MS as in Synthesis Example 1, the composite including hydrophilic fullerene and ionic compound is estimated to have a $C_{60}(OH)_{40-m} \cdot O\text{-TMA}_n$ (n is 1 to 40) structure in which a part of protons of $C_{60}(OH)_{40}$ is substituted with tetramethyl ammonium.

Manufacture of the Polishing Slurry

Preparation Example 1

0.1 Wt % of the compound obtained from Synthesis Example 1, 0.06 wt % of benzotriazole, 0.4 wt % of ammonium dihydrogen phosphate, 0.5 wt % of triammonium citrate, 1.6 wt % of $H_2O_2$ are mixed with the remaining amount of water to provide polishing slurry.

Preparation Example 2

The polishing slurry is obtained in accordance with the same procedure as in Preparation Example 1, except that the compound obtained from Synthesis Example 2 is used instead of the compound obtained from Synthesis Example 1.

Preparation Example 3

Polishing slurry is obtained in accordance with the same procedure as in Preparation Example 1, except that the compound obtained from Synthesis Example 3 is used instead of the compound obtained from Synthesis Example 1.

Preparation Example 4

Polishing slurry is obtained in accordance with the same procedure as in Preparation Example 1, except that the compound obtained from Synthesis Example 4 is used instead of the compound obtained from Synthesis Example 1.

Comparative Preparation Example 1

Polishing slurry is obtained in accordance with the same procedure as in Preparation Example 1, except that silica (primary particle diameter of 15 nanometers (nm), PL-1, FUSO CHEMICAL) is used instead of the compound obtained from Synthesis Example 1.

Reference Example

A polishing slurry is obtained in accordance with the same procedure as in Preparation Example 1, except that the hydroxide fullerene obtained from the Reference Synthesis Example is used instead of the compound obtained from Synthesis Example 1.

Evaluation

The polishing is performed under the following conditions, and a polishing rate (material removal rate, MRR) and a dishing are evaluated.

Polishing Equipment: MA-200e (Musashino Denshi)
Object for Polishing (Wafer):
(1) For calculating a polishing rate: a wafer having a diameter 2 centimeters (cm)*2 cm in which a Cu layer having a thickness of 1.5 micrometers (μm) is formed on the silicon substrate
(2) For evaluating a dishing: MIT854 patterned wafer including a Cu line in a tetraethyl orthosilicate (TEOS) dielectric material, obtained by using a Ta/TaN barrier layer
(3) Polishing pad: IC1000 (Dow Chemical)
(4) Rotating number of polishing plat table: 90 revolutions per minute (rpm)
(5) Rotating number of polishing pad: 90 rpm
(6) Method of supplying a polishing solution: performing a polishing including disposing 100 ml of the polishing slurry on the polishing pad.

The polishing rate is obtained by performing a polishing for 2 minutes, calculating a thickness of the metal layer of before and after the polishing from the electrical resistance, and calculating a rate.

In order to calculate a dishing, for the patterned wafer, a time until Cu of the non-wire part is completely polished is monitored, and the wafer is further polished for an additional 25% of the time (for Cu of the non-wire part to be completely polished), and a step of line & space (line/space=10/10 μm) is measured by an atomic force microscope (AFM).

The results are shown in Table 1.

TABLE 1

| | Polishing rate (nm/min) | Dishing (nm) |
|---|---|---|
| Preparation Example 1 | 123 | 22 |
| Preparation Example 2 | 142 | 23 |
| Preparation Example 3 | 189 | 24 |
| Preparation Example 4 | 240 | 26 |
| Comparative Preparation Example 1 | 99 | 60 |
| Reference Example | 103 | 20 |

Referring to Table 1, it is confirmed that the polishing rate is higher, and the dishing is shallower when performing a polishing with the polishing slurry of Preparation Examples 1 to 4. Particularly, it is confirmed that the dishing is relatively deep in the polishing slurry of Comparative Preparation Example 1 since the abrasive has a large particle diameter (about 40 nm) including the silica agglomeration; on the other hand, the dishing is shallow in the polishing slurry of Preparation Examples 1 to 4 since the abrasive (compounds obtained in Synthesis Examples 1 to 4) has a size of about 1 nm. In addition, it is confirmed that the polishing slurry of Preparation Examples 1 to 4 exhibits a higher polishing rate since the abrasive (the compounds obtained in Synthesis Examples 1 to 4) tends to be adsorbed on the Cu surface, compared to the polishing slurry of the Reference Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A polishing slurry comprising
a composite of a hydrophilic fullerene and an ionic compound, the ionic compound being adsorbed on the hydrophilic fullerene,
wherein the ionic compound comprises tetrabutyl ammonium hydroxide, tetrapropyl ammonium hydroxide, tetraethyl ammonium hydroxide, tetramethyl ammonium hydroxide, or a combination thereof.

2. The polishing slurry of claim 1, wherein the hydrophilic fullerene comprises at least one hydrophilic functional group bound to a fullerene core and the hydrophilic functional group comprises a hydroxyl group, an amino group, a carbonyl group, a carboxyl group, a sulfhydryl group, a phosphate group, or a combination thereof.

3. The polishing slurry of claim 2, wherein the hydrophilic fullerene comprises an average of 2 to 44 functional groups bound to the fullerene core.

4. The polishing slurry of claim 1, wherein the hydrophilic fullerenes is represented by $C_x(OH)_y$ wherein, x is 60, 70, 74, 76, or 78 and y is 2 to 44.

5. The polishing slurry of claim 1, wherein the hydrophilic fullerenes is represented by $C_x(OH)_y$ wherein, x is 60, 70, 74, 76, or 78 and y is 20 to 44.

6. The polishing slurry of claim 1, further comprising a chelating agent, an oxidizing agent, a surfactant, a dispersing agent, or a combination thereof.

7. A polishing slurry of claim 1, comprising
a composite of a hydrophilic fullerene and an ionic compound, the ionic compound being adsorbed on the hydrophilic fullerene, wherein the composite comprising the hydrophilic fullerene and the ionic compound is represented by Chemical Formula 1:

$$C_x(OH)_y.(O\text{-}IP)_z \quad \text{Chemical Formula 1}$$

wherein, in Chemical Formula 1,
IP is an alkyl-substituted quaternary ammonium salt,
x is 60, 70, 74, 76, or 78,
y is 2 to 44, and
z is 1 to 40.

8. A method of manufacturing the polishing slurry of claim 1, comprising
combining fullerene, an ionic compound, and an oxidizing agent and a mixed solvent comprising an organic solvent and water to form a mixture, and
heat treating the mixture to form the composite of the hydrophilic fullerene and the ionic compound, wherein the ionic compound comprises tetrabutyl ammonium hydroxide, tetrapropyl ammonium hydroxide, tetraethyl ammonium hydroxide, tetramethyl ammonium hydroxide, or a combination thereof.

9. The method of claim 8, wherein the heat treating is performed at about 30° C. to about 90° C.

10. The method of claim 8, wherein the organic solvent comprises toluene, benzene, 1-methylnaphthalene, 1,2,4-trimethylbenzene, p-xylene, or a combination thereof.

11. The method of claim 8, wherein the ionic compound is provided in an amount of about 10 to about 500 parts by weight based on 100 parts by weight of the fullerene.

12. The method of claim 8, wherein the hydrophilic fullerene is represented by $C_x(OH)_y$, wherein, x is 60, 70, 74, 76, or 78 and y is 20 to 44.

13. The method of claim 8, wherein the composite comprising the hydrophilic fullerene and the ionic compound are present in the water and
the method further comprises removing the organic solvent after forming the composite comprising the hydrophilic fullerene and the ionic compound to provide the polishing slurry.

14. A method of manufacturing a semiconductor device, the method comprising polishing a surface of the semiconductor device using the polishing slurry of claim 1.

15. A method of polishing a semiconductor device, the method comprising
manufacturing polishing slurry according to the method of claim 8; and
polishing a surface of the semiconductor device using the polishing slurry.

* * * * *